United States Patent [19]

Garg et al.

[11] Patent Number: 5,009,966
[45] Date of Patent: Apr. 23, 1991

[54] HARD OUTER COATINGS DEPOSITED ON TITANIUM OR TITANIUM ALLOYS

[76] Inventors: Diwakar Garg, 2815 Whitemarsh Pl., Macungie, Pa. 18062; Carl F. Mueller, 1221 Tatamy Rd., Easton, Pa. 18042; Leslie E. Schaffer, 244 W. Chestnut St., Macungie, Pa. 18062; Paul N. Dyer, 3920 Pleasant Ave., Allentown, Pa. 18103

[21] Appl. No.: 409,541
[22] Filed: Sep. 19, 1989

Related U.S. Application Data

[62] Division of Ser. No. 139,891, Dec. 31, 1987, Pat. No. 4,902,535.

[51] Int. Cl.$^5$ .......................................... B32B 15/04
[52] U.S. Cl. .................................. 428/627; 428/621; 428/632; 428/660; 428/669; 428/678; 428/936; 428/634
[58] Field of Search ............... 428/660, 632, 633, 627, 428/634, 669, 936, 678

[56] References Cited

U.S. PATENT DOCUMENTS

| | | | |
|---|---|---|---|
| 2,532,283 | 5/1947 | Brenner et al. | 117/50 |
| 2,658,839 | 4/1951 | Talmey et al. | 117/102 |
| 2,801,213 | 7/1957 | Beuckman | 428/660 |
| 2,874,072 | 2/1959 | Cahill et al. | 117/130 |
| 2,900,715 | 8/1959 | Milnes | 428/660 |
| 2,908,966 | 10/1959 | Wagner | 428/660 |
| 2,928,757 | 3/1960 | Lee et al. | 427/328 |
| 3,015,885 | 1/1962 | McEuen et al. | 428/660 |
| 3,486,928 | 12/1969 | Rhoda et al. | 427/437 |
| 3,497,426 | 2/1970 | Okamura | 427/328 |
| 3,936,316 | 2/1976 | Gulla | 427/328 |
| 3,992,211 | 11/1976 | Skoll | 427/437 |
| 3,993,807 | 11/1976 | Stabenow et al. | 427/328 |
| 4,024,303 | 5/1977 | Hahn | 428/660 |
| 4,137,370 | 1/1979 | Fujishiro et al. | 428/660 |
| 4,143,186 | 3/1979 | Davis | 427/345 |
| 4,150,180 | 4/1979 | Potapov et al. | 427/328 |
| 4,305,998 | 12/1981 | Manty et al. | 428/660 |
| 4,340,620 | 7/1982 | Mielsch et al. | 427/304 |
| 4,427,445 | 1/1984 | Holzl et al. | 75/234 |
| 4,612,259 | 9/1986 | Ueda | 428/660 |
| 4,741,975 | 5/1988 | Naik et al. | 428/660 |
| 4,761,346 | 8/1988 | Naik | 428/660 |

FOREIGN PATENT DOCUMENTS

| | | | |
|---|---|---|---|
| 186266 | 7/1986 | European Pat. Off. | 428/627 |
| 188057 | 7/1986 | European Pat. Off. | 428/627 |
| 1209347 | 1/1968 | United Kingdom . | |
| 1540718 | 3/1975 | United Kingdom . | |

OTHER PUBLICATIONS

ASTM-B481-68 (Reapproved 1985) Standard Practice for "Preparation of Titanium and Titanium Alloys for Electroplating".
A. Brenner & G. Riddell U.S. Dept. of Comm.-NBOS-"Deposition of Nickel and Cobalt by Chemical Reduction" Research Paper RP1835.
ASTM-Sp. Tech. Publn. No. 265 1959 "Electroless Nickel Plating".
1987 Am. Vacuum Society "Characterization of Diamondlike Carbon Films and Their Application as Overcoats on Thin-Film Media for Magnetic Recording," pp. 3287-3311, vol. A5(6) Nov.-Dec. 87.

Primary Examiner—John J. Zimmerman

[57] ABSTRACT

The invention discloses a coated substrate product comprised of a titanium of titanium alloy substrate, at least one thin interlayer composed of a non-reactive noble metal and a hard outer coating selected from the group comprised of a ceramic, a hard metal, a hard metal compound and a diamond-like carbon, wherein at least the non-reactive noble metal interlayer which is immediately adjacent to the titanium or titanium alloy substrate is deposited onto the substrate by means of an electroless plating procedure, and the hard outer coating is deposited onto the non-reactive interlayer(s) by means of known chemical and physical vapor deposition techniques. The invention also discloses a method for making these coated substrate products.

14 Claims, No Drawings

HARD OUTER COATINGS DEPOSITED ON TITANIUM OR TITANIUM ALLOYS

This is a division of application Ser. No. 139,891, filed Dec. 31, 1989, now U.S. Pat. No. 4,902,535.

FIELD OF THE INVENTION

This invention relates to a coated substrate product comprised of a titanium or titanium alloy substrate, at least one thin, non-reactive noble metal interlayer and a hard outer coating, and to a method for producing the same.

BACKGROUND OF THE INVENTION

Titanium and titanium alloys are very reactive metals. They react with most of the halogenated and some non-halogenated reagents used in depositing hard, wear, abrasion and erosion protective coatings by a known deposition techniques such as chemical vapor deposition (CVD), CVD-like processes such as plasma-assisted CVD and physical vapor deposition (PVD) processes such as sputtering, plasma spraying and reactive ion plating. Because of their reactivity to halogenated reagents, it is difficult to chemically vapor deposit hard protective coatings that strongly adhere to titanium or titanium alloys. This is true because the halogenated reagents and their reaction products in the CVD and CVD-like processes react with the titanium and titanium alloys, causing spalling of the deposited coating. In the case of PVD processes, stresses due to the mismatch of the coefficients of thermal expansion can lead to poor adhesion and spalling.

Since noble materials such as cobalt, rhodium, iridium, nickel, palladium, platinum, copper, silver and gold do not react with halogenated reagents, it is conceivable to plate titanium and titanium alloys first with one of the noble materials and then coat them with hard protective coatings using known chemical and physical vapor deposition techniques. In fact, U.S. Pat. No. 4,427,445 peripherally discloses a process of depositing hard fine-grained tungsten and carbon alloy on titanium. It discloses that it is preferable to coat the substrate first by electrochemical deposition of a more noble material such as nickel or copper when depositing tungsten and carbon alloy on it.

Unfortunately, in the case of titanium and titanium alloys, normal electroplating procedures for noble materials do not yield an adherent deposit. This is because of the fact that titanium and titanium alloys rapidly form a tenacious oxide film in the presence of air and moisture. This oxide film is extremely difficult to remove by normal pre-plating and electroplating techniques. Additionally, this oxide film reforms very quickly as a result of a reaction between titanium and titanium alloys and water or solutions used in pre-plating and electroplating baths.

Because of the above problems with depositing adherent noble materials by normal electroplating techniques, special processes have been developed for preparing titanium and titanium alloys for electroplating. Three such processes for preparing titanium and titanium alloys for electroplating are discussed in the American Society for Testing and Materials (ASTM) Standard No. B481 entitled "Standard practice for Preparation of Titanium and Titanium Alloys for Electroplating." These methods describe that the adhesion of the electrodeposit is mechanical and, for this reason, it may be less than adequate. To improve adhesion, these methods suggest using nickel as an intermediate coating and heat treating it in an inert gas atmosphere for 1 to 4 hours at 540° to 800° C. The heat treatment causes interdiffusion of the nickel and titanium and produces a metallurgical bond.

The heat treatment of titanium and titanium alloys in a temperature ranging from 540° to 800° C. even for 1 hour, however, is undesirable from the standpoint of the mechanical strength of titanium and titanium alloys. This temperature range is close to both aging and heat treating temperature of titanium and titanium alloys. It has been found that heat treating them in this temperature range severely affects their mechanical properties.

Therefore, it is desirable to deposit adherent noble material on titanium and titanium alloys prior to coating them with ceramics, hard metal and metal compounds and diamond-like carbon. Additionally, it is desirable to deposit adherent noble material on titanium and titanium alloys without exposing them to undesirable high temperatures such as temperatures ranging from 540° to 800° C.

British Pat. No. 1,540,718 discloses a process for the formation of wear resistant hard coating consisting of $W_3C$ using a mixture of $WF_6$, benzene, toluene or xylene and hydrogen under sub-atmospheric pressure and temperatures ranging from 350° to 500° C. As that patent points out, it is difficult to obtain good direct adhesion between $W_3C$ and steel substrates. As a means of overcoming this difficulty, this patent suggests interposing an additional thin layer containing nickel or cobalt between the steel and the $W_3C$ in order to get a good wear-resistant surface on the steel substrate. British Pat. No. 1,540,718 does not teach a process for coating non-ferrous metals and alloys with $W_3C$.

BRIEF DESCRIPTION OF THE INVENTION

The invention discloses a coated substrate product comprised of a titanium or titanium alloy substrate, at least one thin interlayer comprised of a non-reactive noble metal and a hard outer coating comprised of a ceramic, a hard metal, a hard metal compound or a diamond-like carbon, wherein at least the non-reactive noble metal interlayer which is immediately adjacent to the titanium or titanium alloy substrate is deposited onto the substrata by means of an electroless plating procedure, and the hard outer coating is deposited onto the non-reactive noble metal interlayer(s) by means of known CVD, CVD-like and PVD techniques. By means of the invention, wear, abrasion and erosion resistant coatings can be deposited by CVD, CVD-like or PVD processes onto the surface of titanium and titanium alloys, with good adhesion and without significant degradation of the mechanical properties of the substrate.

The invention also discloses a method for depositing adherent, hard metal, metal compound, ceramics or diamond-like carbon outer coatings onto titanium or titanium alloys. The non-reactive noble metal interlayer is comprised of a noble metal selected from the group comprised of cobalt, rhodium, iridium, nickel, palladium, platinum, copper, silver and gold, alloys thereof and mixtures thereof. According to the method of the present invention, at least one thin interlayer of the non-reactive noble metal is deposited on the substrate before the hard outer coating is deposited onto the substrate. Conventional electroplating procedures are not used to deposit the thin non-reactive noble metal interlayer which is immediately adjacent to the titanium or titanium alloy. Instead, according to the method of the invention, this thin noble metal interlayer is deposited by means of an electroless deposition technique. Conventional electroplating techniques can be used to deposit additional thin interlayers once the initial "titanium touching" interlayer has been deposited. Finally, according to the invention, the hard outer coating is deposited onto the non-reactive noble metal interlayer using known deposition techniques.

In practicing the method of the invention, it is preferable for the titanium or titanium alloys to be mildly abraded before the first non-reactive noble metal interlayer is deposited by electroless deposition techniques. It is also preferable, once the interlayer(s) has been deposited, to heat treat the titanium or titanium alloy substrate, with its initial electroless deposited interlayer, and if they exist, any additional interlayers, to a temperature up to about 525° C. and preferably in the range of about 200° to 475° C. to improve the adhesion between the titanium and/or titanium alloy substrate and electrolessly deposited interlayer. The mild abrasion procedure helps in removing the tenacious oxide layer from the surface of the titanium and titanium alloys. It also helps assure good bonding between the initial electrolessly deposited non-reactive noble metal interlayer and the highly reactive titanium or titanium alloy substrate. The heat treatment, on the other hand, further improves the adhesion between the initial electrolessly deposited non-reactive interlayer and a highly reactive titanium and titanium substrate possibly by transforming part of the amorphous electrolessly deposited interlayer to a highly crystalline interlayer.

DETAILED DESCRIPTION OF THE INVENTION

The invention discloses a new coated substrate product comprised of a titanium or titanium alloy substrate, at least one thin interlayer comprised of a non-reactive noble metal and a hard outer layer comprised of a ceramic, a hard metal, a hard metal compound or a diamond-like carbon. The invention also discloses a method for producing these new coated substrate products. According to the method, the substrate product's interlayer(s) will be comprised of the non-reactive noble metal referred to above. In addition, according to the method of the invention at least the noble metal interlayer which is immediately adjacent to the titanium or titanium alloy substrate will be deposited onto the substrate by means of an electroless plating procedure of the type set forth below.

The titanium alloys that can be deposited with hard metal, metal compound, ceramic or diamond-like carbon coatings include, but are not limited to, alloys of following elements: Ti/Al/V, Ti/Al/Sn, Ti/Al/Mo/V, Ti/Al/Sn/Zn/Mo, Ti/Al/V/Cr, Ti/Mo/V/Fe/Al, Ti/Al/V/Cr/Mo/Zn, and Ti/Al/V/Sn. More specifically they include: Ti/6Al/4V, Ti/5Al/2.5Sn, Ti/8Al/1Mo/1V, Ti/6Al/2Sn/4Zn/2Mo, Ti/6Al/2Sn/4Zn/6Mo, Ti/3Al/2.5V, Ti/13V/11Cr/3Al, Ti/11.5Mo/6Zn/4.5Sn, Ti/8Mo/8V,2Fe/3Al, Ti/3Al/8V/6Cr/4Mo/4Zn, and the like.

As discussed earlier, titanium and metals containing titanium, e.g. titanium alloys, oxidize very rapidly when exposed to water and air. As a result of this oxidation these metals are normally covered with an oxide film which is tenacious and difficult to remove. Because of the presence of this oxide film, conventional methods for electroplating metals or depositing hard coatings by known deposition methods have not been successful to deposit adherent coatings when used with titanium and titanium alloys. The method of the present invention teaches those skilled in the art how to overcome this problem. According to the method, at least one thin layer of a noble metal is first deposited onto the titanium or titanium alloy substrate by means of an electroless plating technique. The electroless plating technique utilizes a solution which contains reactive anions, such as chlorides, fluorides or acetates, which help in dissolving the oxide film in situ while the noble metal is being deposited. Procedures for carrying out electroless plating of noble metals are well known to those skilled in the art. For example, the deposition of nickel and cobalt by chemical reduction or electroless technique has been described in detail in a research report by A. Brenner and G. Riddell, "Deposition of Nickel and Cobalt by Chemical Reduction," Research Paper RP 1835, *Journal of research of the National Bureau of Standards*, Volume 39, November 1947, which detailed description is incorporated herein by reference. This report describes deposition of nickel and cobalt using alkaline as well as acid solutions. The electroless nickel plating processes are also described in the "Symposium on Electroless Nickel Plating" published by the American Society for Testing Materials, ASTM Special Technical Publication No. 265, 1959, which is also incorporated herein by reference. The processes of electroless nickel plating are also described in detail in the U.S. Pat. Nos. 2,532,283 and 2,658,839. The processes for depositing copper by electroless technique are described in the U.S. Pat. Nos. 2,874,072 and 4,143,186. British Pat. No. 1,209,347 describes a method of depositing cobalt, copper, silver, gold, and nickel by an electroless technique. The descriptions of all of these processes for depositing metals by electroless techniques are incorporated herein by reference. In addition to depositing a single noble metal, mixtures of noble metals can also be deposited by electroless deposition techniques. For example, a mixture of nickel-cobalt deposited by electroless technique can be used as an interlayer. The method of co-depositing nickel-cobalt has been described in detail in the research paper by A. Brenner and G. Riddell discussed earlier.

According to the invention, more than one interlayer can be deposited. If more than one thin interlayer is deposited, conventional electroplating procedures may be used to deposit layers other than the initial layer which is immediately adjacent to the titanium substrate. Following deposition of the noble metal interlayer(s), the hard outer coating is deposited onto the thin metal interlayer(s) by means of known deposition techniques.

In the method of the invention, it is preferable to clean the surface of the titanium or titanium alloy by abrading the surface with an abrasive material or grinding prior to depositing the initial thin interlayer of noble metal in order to remove any oxides from the surface. If abrading is used to clean the surface of the titanium and titanium alloys, the method teaches using such abrasive materials as either $Al_2O_3$ or SiC particles. The selection of the particle size of $Al_2O_3$ or SiC, angle of impingement, and impact velocity is very important for removing the oxides from the surface of the substrate. These variables should be selected in a way to yield minimum embedment of the particles in the substrate. For example, it is preferred to use 150 grit $Al_2O_3$ or SiC particles at low impingement angles, i.e. less than or equal to ($\leq$)

50°, and low impact velocity, to minimize particle embedment.

It is also preferable in the method of this invention to deposit the initial thin interlayer of noble metal immediately after or within one hour of removing the oxides from the surface by abrading or grinding. The time for this operation is critical for minimizing the re-formation of oxide layer on the substrate as well as obtaining good adhesion between the substrate and the initial thin interlayer. In a more preferred embodiment of this invention after the deposition of the noble metal(s), the titanium or titanium alloy substrate, with its thin noble metal interlayer(s) bonded thereto, should be (1) heat treated to temperatures in the range of about 200° to 300° C. for a few hours in the presence of air or (2) heat treated to temperatures in the range of about 200° to 475° for a few hours in the presence of inert gas such as argon, helium or mixtures of argon and helium, or (3) used immediately or within 24 hours in the deposition reactor and coated with the hard metal, metal compound, ceramic or diamond-like carbon coatings at temperatures equal to or less than 525° C. The heat treatment between 200° to 300° C. in air helps in improving the adhesion between the initial noble material interlayer and titanium and titanium alloy. It also helps in long-term storage of the plated substrate for subsequent processing in the CVD reactor. The heat treatment between 200° to 475° C. in inert gas results in improving the adhesion between the initial noble material interlayer on titanium or titanium alloys. It also helps in long-term storage of the plated substrate for subsequent processing in the deposition reactor. Although the true reason of improvement in bonding is unknown, it is believed to be due to crystallization of a thin layer of initial interlayer. The heat treatment temperature of about 200° to 475° C. is substantially below the 540° to 800° C. temperature range suggested in the ASTM Standard Number B481 which was mentioned earlier. A temperature of 540° C. would effect the mechanical properties of the titanium or titanium alloy substrate. Fortunately, a heat treatment at about 200° to 475° C. does not significantly effect the mechanical properties of these substrates. Furthermore, it has been surprisingly found that this heat treatment provides good long term bonding between the noble metal interlayer(s) and the titanium or titanium alloy substrate. The bonding of the thin noble metal interlayer to the titanium and titanium alloy substrate is also achieved by coating the substrate with the hard outer coating by known low temperature deposition processes immediately after or within 24 hours of depositing the thin interlayer. In the known low temperature deposition processes, the substrate is exposed to temperatures ranging from about 350° to 525° C. in the presence of inert and/or reactive gases, causing in situ heat treatment of the initial noble metal interlayer. This in situ heat treatment, therefore, greatly improves the adhesion between the substrate and the thin noble metal interlayer. Additionally, it helps in further improving the adhesion between the initial noble metal interlayer and titanium or titanium alloys to subject the titanium or titanium alloy substrate to a pre-heat treatment in the range of about 200° to 300° C. in air or about 200° to 475° C. in an inert gas. If the temperature used in the known deposition process is less than about 400° C., it is preferred to heat treat the substrate plated with noble metal between about 400° to about 475° C. in inert gas prior to depositing the hard coating.

The method of the present invention is especially useful for depositing a ceramic, a hard metal, a hard metal compound or a diamond-like carbon coating onto titanium or titanium alloys by low temperature ($\leq 525°$ C.) known deposition process. As used herein, the term "ceramic" means oxides, carbides, nitrides, carbonitrides, borides and silicides of the Group IIIB or Group IVB elements of the periodic Table and mixtures thereof having a hardness of 1,000 Vickers or more. The term "hard metal" means transition element metals such as tungsten with a hardness of 350 Vickers or more. The term "hard metal compound" means oxides, carbides, nitrides, carbonitrides, silicides and borides of transition element metals such as tungsten or titanium and mixtures thereof which have a hardness of 1,000 Vickers or more. The term "diamond-like carbon" means a carbon having a hardness of greater than 1,000 Vickers characterized and deposited as described in "Critical Review Characterization of Diamond-like Carbon Films and their Application as Overcoats on Thin-Film Media for Magnetic Recording", by H. Tsai and D. B. Bogg, *Journal Vacuum Science Technology*, Volume A5(6), Nov./Dec. 1987, pages 3287–3311, which description is incorporated herein by reference.

According to the invention, the noble metal interlayer(s) should be thin. As used herein, the term "thin" means an interlayer having a thickness of about 0.5$\mu$m to about 15$\mu$m. If more than one interlayer is deposited, it is preferable if the combined thickness of the layers does not exceed about 15$\mu$m. As used herein the term "noble metal" means a non-reactive metal such as cobalt, rhodium, iridium, nickel, palladium, platinum, copper, silver and gold, alloys thereof and mixtures thereof.

As discussed above, the non-reactive interlayer(s) of noble metal has been found to improve coating adhesion. It is believed that this interlayer helps in reducing the stresses caused by the mismatch of the coefficients of thermal expansion between the substrate and the hard coating or the stresses caused by the subsequent deposition of the hard outer coating. In particular, this interlayer has also been found to protect the substrate from the attack of hot and corrosive gases during deposition of the hard coating.

Once the thin interlayer(s) of noble metal has been deposited onto the titanium or titanium alloy substrate, a hard outer coating is deposited on top of the interlayer by known deposition techniques. In preferred forms, the hard metal layer such as tungsten is chemical vapor deposited using a mixture of metal chloride or metal fluoride and hydrogen gases in a typical CVD reactor. Hard metal compounds such as tungsten carbide, on the other hand, are deposited using a mixture of metal chloride or metal fluoride, hydrogen and carbon containing organic gases. The chemical vapor deposition is conducted under atmospheric or sub-atmospheric pressure. Additionally, it is conducted under low temperatures, varying from about 350° to 525 ° C., to prevent degradation of the mechanical properties of the titanium metal or titanium metal alloys. Deposition temperatures closer to 460° C. are especially preferred. This process is described in more detail in U.S. Ser. No.07/092,809, filed 3 Sept. 1987, which description is incorporated herein by reference.

The controls and examples which follow illustrate the method of the invention and of the coated substrate products produced thereby and are not meant to limit the scope of the claims in any way.

CONTROL 1

A sample of titanium alloy (Ti/6Al/4V) was placed in an inductively heated graphite furnace inside a gas-tight quartz envelope. The specimen was heated to a temperature of about 457° C. under flowing hydrogen and argon mixture. At the reaction temperature of 457° C., a gaseous mixture of 300 cc/min $WF_6$, 3,000 cc/min of $H_2$, and 40 cc/min of DME (dimethyl ether) was passed into the furnace over the specimen to coat it with tungsten carbide. The total pressure within the system was maintained at 40 Torr. The deposition was conducted for 40 minutes; thereafter, the flow of the reactive gases was stopped and the specimen was cooled under flowing argon and hydrogen mixture.

Upon removal of the specimen from the reactor, the coating was found to have flaked off completely. Control 1 shows that titanium alloys cannot be coated with a hard coating by using conventional chemical vapor deposition techniques.

CONTROL 2

A sample of titanium alloy (Ti/6Al/4V) which had been electrochemically plated with a 5 micron thick layer of nickel was placed in a reactor identical to that used in Control 1. The titanium alloy electroplated with nickel was not heat treated prior to subjecting it to the chemical vapor deposition process. However, it was heat treated during the process. The specimen was heated under a flowing mixture of hydrogen and argon to about 457° C. At this temperature, a gaseous mixture of 300 cc/min of $WF_6$ and 3,000 cc/min of $H_2$ was passed into the furnace over the specimen for 40 minutes to coat it with tungsten. The total pressure within the system was maintained at 40 Torr. After 40 minutes of deposition time, the flow of reactive gases was stopped and the specimen was cooled under flowing hydrogen argon mixture.

The specimen was coated with a dull coating of tungsten. However, bubbles were noted in the coating. In fact, the coating peeled off easily from the specimen. Examination of the peeled coating and failed surface of the specimen revealed adhesive failure of the nickel interlayer.

Control 2 illustrates that even when a titanium alloy had been deposited electrochemically with a nickel interlayer, the hard coating will easily peel off the specimen. In addition, this control illustrates the poor adhesion between the underlying substrate and a nickel interlayer which had been deposited electrochemically. It also shows that the in situ heat treatment of electroplated nickel at 457° C. does not help in improving the adhesion of nickel to the substrate.

CONTROL 3

To determine the adhesion of electrochemically deposited nickel on Ti/6Al/4V, a sample which had been electrochemically deposited with nickel was placed in an ultrasonic bath filled with n-hexane. The titanium alloy electroplated with nickel was not heat treated after plating. The nickel layer was found to flake off after approximately 15 minutes in the ultrasonic bath. This experiment also revealed poor adhesion of electrochemically deposited nickel on titanium alloy.

CONTROL 4

Another sample of Ti/6Al/4V which had been electrochemically deposited with nickel was bent close to 90° using a standard 3-point bend procedure to determine the quality of coating adhesion. Again, the plated specimen was not heat treated after plating. The nickel layer, once again, peeled off, indicating the poor quality of the adhesion of the electrochemically deposited nickel on the titanium alloy.

CONTROL 5

Another sample of Ti/6Al/4V which had been electrochemically deposited with nickel was heat treated for 4 hours at 455° C. in a furnace at 1 atmosphere under flowing 5% hydrogen/95% argon mixture. The heat treated specimen was bent close to 90° to determine the quality of coating adhesion. The nickel layer, once again, peeled off, indicating the poor adhesion between electrochemically deposited and heat treated nickel and titanium alloy.

Control 5 illustrates that the heat treatment at 455° C. for 4 hours does not enhance the adhesion of electrochemically deposited nickel on titanium alloy.

EXAMPLE 1

A sample of Ti/6Al/4V was plated with 5μm thick nickel using the acid type of electroless nickel plating technique similar to that described in the Research paper RP 1835 by A. Brenner and G. Riddel, referred to above. The specific electroless bath consisted of nickel sulfate, sodium hypophosphite and sodium acetate as described in the Research Paper RP 1835. The concentrations of various chemicals present in the bath were similar to those presented in the paper and the bath was operated in the pH range 4 to 6. The surface of Ti/6Al/4V was not pre-cleaned to remove the oxide layer prior to plating with electroless nickel. The nickel plated Ti/6Al/4V specimen was bent close to 90° to determine the quality of coating adhesion. Although the nickel did not peel off to extent shown in the case of Control 5, the nickel layer did partially flake off.

EXAMPLE 2

Another sample of Ti/6Al/4V was plated with 5μm thick nickel using the electroless technique as described in Example 1. The surface of Ti/6Al/4V was not pre-cleaned prior to plating with electroless nickel. The nickel plated specimens was heat treated at 288° C. for 2-3 hours in air. After heat treatment the specimen was bent close to 90° to determine the quality of coating adhesion. The nickel layer, once again, partially flaked off.

EXAMPLE 3

Another sample of Ti/6Al/4V was plated with 5μm thick nickel using the electroless technique as described in Example 1. The surface of Ti/6Al/4V was not pre-cleaned prior to plating with electroless nickel. The nickel plated specimen was heat treated at 455° C. for 8 hours in a furnace at 1 atmosphere under flowing 5% hydrogen/95% argon mixture. The heat treated specimen was bent close to 90° to determine the quality of coating adhesion. The nickel layer, once again, partially flaked off.

The results of Examples 1-3 indicate that although electroless plating techniques, in general, show improvements over electrochemical deposition of the prior art, good adhesion was not achieved with electroless nickel technique without proper surface treatment. They also show that heat treatment at or below 455° C.

without precleaning the surface does not enhance adhesion.

EXAMPLE 4

Two specimens of Ti/6Al/4V were plated with 5μm thick nickel using the electroless technique as described in Example 1. Prior to plating these specimens, the surface of one of the specimens was cleaned by abrading it with 150 grit $Al_2O_3$ entrained in high pressure (20 psig) supply air. The surface of the other specimen was cleaned with $Al_2O_3$ using low pressure (10 psig) supply air. The nickel plated specimens, which were cleaned by $Al_2O_3$ using low and high pressure air, were bent close to 90° to determine the quality of coating adhesion. Both specimens showed some signs of coating spallation but not as much as in Examples 1-3, indicating that abrading the surface with $Al_2O_3$ improves adhesion.

One of the nickel plated specimens was sectioned, mounted and polished to further determine the quality of nickel adhesion on Ti/6Al/4V. The cross-section of the specimen showed no signs of coating delamination. The EDS digital element X-ray map showed the presence of Ni and P in the nickel layer. Additionally, it showed no penetration of either Ni or P into the substrate. The XRD analysis of the nickel layer revealed the presence of nickel having a very small crystallite size or being nearly amorphous. The XRD analysis, however, did not detect the presence of P in the nickel layer, indicating that if it was present it would be amorphous. The spallation of the nickel layer during the 3-point bend test, may therefore, be related the low crystallinity or the nearly amorphous nature of the nickel layer.

Example 4 shows that cleaning of the substrate by abrading with $Al_2O_3$ prior to nickel plating using an electroless technique helps in improving adhesion of the nickel to the substrate.

EXAMPLE 5

Two more Ti/6Al/4V specimens were cleaned by abrading with $Al_2O_3$ and plated with electroless nickel using the procedures described in Example 4. The nickel plated specimens were heat treated at 288° C. in air for 2-3 hours. They were then bent close to 90° to determine the quality of coating adhesion. Both specimens showed some signs of coating spallation, but the limited extent of the spallation indicated that the heat treatment of the electroless nickel plated specimens pre-cleaned by abrading prior to plating improved the adhesion between the nickel and the substrate.

One of the nickel plated and heat treated specimens was sectioned, mounted and polished to further determine the quality of nickel adhesion on Ti/6Al/4V. The cross-section showed no signs of coating delamination. The EDS digital elemental X-ray map showed the presence of Ni and P in the nickel layer. However, it did not show any penetration of either Ni or P into the substrate. The XRD analysis of nickel layer revealed the presence of low crystalline Ni. The crystallite size of Ni in this sample was slightly higher than that noted in Example 4. The XRD analysis, however, did not reveal the presence of P in the nickel layer, indicating that if it was present it would be amorphous. The improved adhesion of the nickel layer to the substrate could, therefore, be attributed to increased cyrstallinity of the nickel.

Example 5 shows that the heat treatment at 288° C. in air of the substrate cleaned by abrading with $Al_2O_3$ and plated with nickel using the electroless technique improves the adhesion of the nickel.

EXAMPLE 6

Two more Ti/6Al/4V specimens were cleaned by abrading with $Al_2O_3$ and plated with electroless nickel using the procedures described in Example 4. The metal plated specimens were heat treated at 455° C. for 4 hours in a furnace at 1 atmosphere under flowing 5% hydrogen/95% argon mixture. The heat treated specimens were bent close to 90° to determine the quality of coating adhesion. Surprisingly, no signs of coating spallation were observed.

One of the nickel plated and heat treated specimens was sectioned, mounted and polished to examine the coating adhesion. The cross-section showed no signs of coating delamination. The EDS line scan of the cross-section showed the presence of Ni and p in the coating. It, however, did not show any penetration of Ni or P into the substrate. The XRD of the Ni layer revealed the presence of crystalline Ni as well as $Ni_3P$. The improved adhesion of the nickel layer to the substrate could be attributed to the presence of the more crystalline Ni and $Ni_3P$ layer.

Example 6 shows that heat treatment at 455° C. of the substrates cleaned by abrading with $Al_2O_3$ and plated with nickel using the electroless technique resulted in an improvement in the adhesion of the nickel deposit on the substrates.

EXAMPLE 7

Several specimens of Ti/6Al/4V were cleaned using 150 grit $Al_2O_3$ entrapped in 20 psig supply air. The cleaned specimens were then nickel plated with a 5μm thick layer using the electroless technique as described in Example 1. Half of the specimens were heat treated at 288° C. for 2-3 hours in air, and the other half were not treated at all. These specimens were used in several CVD experiments to coat them with hard metal and metal carbides.

EXAMPLE 8

Two samples of titanium alloy (Ti/6Al/4V) one nickel plated and the other nickel plated and heat treated as described in Example 7, were placed in a reactor identical to that used in Control 1. The specimens were heated under flowing hydrogen and argon mixture to 460° C. At this temperature, a gaseous mixture of 300 cc/min of $WF_6$, 3,000 cc/min of $H_2$, and 4000 cc/min of Ar was passed into the furnace over the specimens for 15 minutes to coat them with tungsten. The total pressure within the system was maintained at 40 Torr. After the reaction time, the flow of reactive gases was stopped and the specimens were cooled under flowing hydrogen and argon mixture.

The specimens were coated with a dull, adherent, coherent, and uniform coating of 10 micron thick on each side. The coating consisted of tungsten as determined by XRD analysis. The coating showed a columnar structure, and had a hardness of 605±14 Vickers. This example, therefore, shows that a protective interlayer of nickel deposited by cleaning the surface of the titanium alloy by abrading helps produce an adherent coating of tungsten on titanium alloy. It also shows that the external heat treatment of the nickel deposited with cleaning the surface by abrading is not necessary as long as the nickel plated specimens are heat treated in situ during the chemical vapor deposition process.

EXAMPLE 9

Two specimens of titanium alloy (Ti/6Al/4V), one nickel plated and the other nickel plated and heat treated as described in Example 7, were placed in a reactor identical to that used in Control 1. The specimens were heated under flowing hydrogen and argon mixture to 457° C. At this temperature, a gaseous mixture of 300 cc/min of $WF_6$, 3,000 cc/min of $H_2$, and 40 cc/min. of dimethyl ether was passed into the furnace over the specimens for 55 minutes. The total pressure within the system was maintained at 40 Torr. After the reaction time, the flow of reactive gases was stopped and the specimens were cooled under flowing hydrogen and argon mixture.

The specimens were coated with a smooth, bright, adherent, and coherent coating of ~28μm thick on each side. The coating had a fine-grained, non-columnar structure. It consisted of a mixture of W and $W_3C$ phases, as determined by XRD. The coating had a hardness of 2,150±128 Vickers. This example, therefore, shows that a protective interlayer of nickel deposited by cleaning the surface by abrading helps produce an adherent hard coating of tungsten/tungsten carbide on titanium alloy. It also shows that the external heat treatment of the nickel deposited by cleaning the surface by abrading is not necessary as long as the nickel plated specimens are heat treated in situ during chemical vapor deposition process.

EXAMPLE 10

A specimen of titanium alloy (Ti/6Al/4V) nickel plated and heat treated as described in Example 7 was placed in a reactor identical to that used in Control 1. The specimen was heated under flowing hydrogen and argon mixture to 460° C. At this temperature, a gaseous mixture of 300 cc/min of $WF_6$, 3000 cc/min of $H_2$ and 55 cc/min of dimethyl ether was passed into the furnace over the specimen for 20 minutes. The total pressure within the system was maintained at 40 Torr. After the reaction time, the flow of reactive gases was stopped and the specimen was cooled under flowing hydrogen and argon mixture.

The specimen was coated with a smooth, bright, adherent and coherent coating of ~10 μm thickness on each side. The coatings had a fine-grained, non-columnar structure. It consisted of a mixture of W, $W_2C$ and $W_3C$ phases, as determined by XRD. The coating had a hardness of ~2250 Vickers. This example, therefore, shows that a protective interlayer of nickel deposited by cleaning the surface by abrading helps produce an adherent hard coating of tungsten/tungsten carbide on titanium alloy.

EXAMPLE 11

A specimen of titanium alloy (Ti/6Al/4V) nickel plated and heat treated as described in Example 7 was placed in a reactor identical to that used in Control 1. The specimen was heated under flowing hydrogen and argon mixture to 460° C. At this temperature, a gaseous mixture of 300 cc/min of $WF_6$, 3,000 cc/min of $H_2$ and 85 cc/min of dimethyl ether was passed into the furnace for 70 minutes. The total pressure within the system was maintained at 40 Torr. After the reaction time, the flow of reactive gases was stopped and the specimen was cooled under flowing hydrogen and argon mixture.

The specimen was coated with a smooth, bright, adherent and coherent coating of ~24 μm thickness on each side. The coating had a fine-grained, non-columnar structure. It consisted of a mixture of W and $W_2C$ phases, as determined by XRD. The coating had a hardness of ~2790 Vickers. This example, once again, shows that a protective interlayer of nickel deposited by cleaning the surface by abrading helps produce an adherent hard coating of tungsten/tungsten carbide on titanium alloy.

Examples 8-11 show that a titanium alloy which had been (1) cleaned by abrading with $Al_2O_3$, (2) plated with nickel using an electroless technique, and (3) heat treated at 288° C. in air or in situ in the CVD reactor could be coated with a dull adherent cohesive and uniform coating of hard tungsten or with a bright, strongly adherent, cohesive, uniform coating of hard tungsten/tungsten carbide.

EXAMPLE 12

Another sample of Ti/6Al/4V which had been (1) cleaned by abrading with $Al_2O_3$, (2) plated with a 1 micron thick nickel using the electroless technique as described in Example 1 followed by a 4 micron thick layer of copper deposited by an electrochemical technique and (3) heat treated at 288° C. for 2-3 hours in air was coated with tungsten using conditions identical to those described in Example 8. The specimen was, again, coated with a dull, adherent, coherent and uniform coating of 10 micron thick tungsten on each side. The coating showed a columnar structure, and had a hardness of 473±17 Vickers. This example also shows that a protective layer of nickel followed by copper can be used to provide an adherent hard coating of tungsten on titanium alloy.

EXAMPLE 13

Two samples of Ti/6Al/4V, one electrolessly plated with a 5 micron thick layer of nickel using the procedure described in Example 1 and the other with an electrolessly deposited with 1 micron thick layer of nickel using the Example 1 procedure followed by a 4 micron thick layer of electroplated copper, was placed in a reactor as described in Control 1. Both specimens were cleaned by abrading prior to plating. Additionally, they were heat treated at 288° C. in air for 2-3 hours. The specimens were coated with hard tungsten carbide. The reaction pressure was similar to that used in Example 10. The flow of gaseous mixture was also similar to Example 10. A reaction time of 20 minutes was used for coating.

The specimens were coated with a bright, smooth, adherent, coherent and uniform coating of 10 microns thick on each side. The coating was free of columnar structure, and consisted of extremely fine grains. Additionally, it had a well-defined, layered microstructure with layers 1-2 microns apart. The hardness of the coating was 2189±80 Vickers. The composition of the coating was determined by XRD. It comprised of a mixture of W, $W_2C$ and $W_3C$ phases. This example, therefore, shows that interlayers of nickel followed by copper can be very successfully used to provide a hard, adherent coating of tungsten carbide on titanium alloy.

Examples 12 and 13 illustrate that more than one interlayer of a noble metal can be deposited on the titanium substrate before the hard overcoat is deposited thereon.

EXAMPLE 14

Two samples of titanium alloy (Ti/6Al/4V) one nickel plated and the other nickel plated and heat treated as described in Example 7, were placed in a reactor identical to that used in Control 1. The specimens were heated under flowing argon to 460° C. At this temperature, a gaseous mixture of 300 cc/min of $WF_6$, 3,000 cc/min of $H_2$, and 4,000 cc/min of Ar was passed into the furnace over the specimens for 15 minutes to coat them with tungsten. The total pressure within the system was maintained at 40 Torr. After the reaction time, the flow of reactive gases was stopped and the specimens were cooled under flowing argon.

The specimens were coated with a dull, adherent, coherent, and uniform coating of 10 micron thick on each side. The coating consisted of tungsten as determined by XRD analysis. The coating showed a columnar structure, and had a hardness of 605±14 Vickers. This example, therefore, shows that a protective interlayer of nickel deposited by cleaning the surface of the titanium alloy by abrading helps produce an adherent coating of tunsten on titanium alloy. It also shows that the external heat treatment of the nickel deposited with cleaning the surface of abrading is not necessary as long as the nickel plated specimens are heat treated in situ during the chemical vapor deposition process.

EXAMPLE 15

Two specimens of titanium alloy (Ti/6Al/4V), one nickel plated and the other nickel plated and heat treated as described in Example 7, were placed in a reactor identical to that used in Control 1. The specimens were heated under flowing argon to 457° C. At this temperature, a gaseous mixture of 300 cc/min. of $WF_6$, 3,000 cc/min. of $H_2$, and 40 cc/min. of dimethyl ether was passed into the furnace over the specimens for 55 minutes. The total pressure within the system was maintained at 40 Torr. After the reaction time, the flow of reactive gases was stopped and the specimens were cooled under flowing argon.

The specimens were coated with a smooth, bright, adherent, and coherent coating of ~28μm thick on each side. The coating had a fine-grained, non-columnar structure. It consisted of a mixture of W and $W_3C$ phases, as determined by XRD. The coating has a hardness of 2,150 ±128 Vickers. This example, therefore, shows that a protective interlayer of nickel deposited by cleaning the surface by abrading helps produce an adherent hard coating of tungsten/tungsten carbide on titanium alloy. It also shows that the external heat treatment of the nickel deposited by cleaning the surface by abrading is not necessary as long as the nickel plated specimens are heat treated in situ during chemical vapor deposition process.

EXAMPLE 16

A specimen of titanium alloy (Ti/6Al/4V) nickel plated and heat treated as described in Example 7 was placed in a reactor identical to that used in Control 1. The specimen was heated under flowing argon to 460° C. At this temperature, a gaseous mixture of 300 cc/min. of $WF_6$, 3000 cc/min. of $H_2$ and 55 cc/min. of dimethyl ether was passed into the furnace over the specimen for 20 minutes. The total pressure within the system was maintained at 40 Torr. After the reaction time, the flow of reactive gases was stopped and the specimen was cooled under flowing argon.

The specimen was coated with a smooth, bright, adherent and coherent coating of ~10 μm thickness on each side. the coatings had a fine-grained, non-columnar structure. it consisted of a mixture of W, $W_2C$ and $W_3C$ phases, as determined by XRD. The coating had a hardness of ~2250 Vickers. This example, therefore, shows that a protective interlayer of nickel deposited by cleaning the surface by abrading helps produce an adherent hard coating of tungsten/tungsten carbide on titanium alloy.

EXAMPLE 17

A specimen of titanium alloy (Ti/6Al/4V) nickel plated and heat treated as described in Example 7 was placed in a reactor identical to that used in Control 1. The specimen was heated under flowing argon to 460° C. At this temperature, a gaseous mixture of 300 cc/min. of $WF_6$, 3,000 cc/min. of $H_2$ and 85 cc/min. of dimethyl ether was passed into the furnace for 70minutes. The total pressure within the system was maintained at 40 Torr. After the reaction time, the flow of reactive gases was stopped and the specimen was cooled under flowing argon.

The specimen was coated with a smooth, bright, adherent and coherent coating of ~24μm thickness on each side. The coating had a fine-grained, non-columnar structure. It consisted of a mixture of W and $W_2C$ phases, as determined by XRD. The coating had a hardness of ~2790 Vickers. This example, once again, shows that a protective interlayer of nickel deposited by cleaning the surface by abrading helps produce an adherent hard coating of tungsten/tungsten carbide on titanium alloy. Examples 14–17 show that a titanium alloy which had been (1) cleaned by abrading with $Al_2O_3$, (2) plated with nickel using an electroless technique, and (3) heat treated at 288° C. in air or in situ in the CVD reactor could be coated with a dull adherent, cohesive and uniform coating of hard tungsten or with a bright, strongly adherent, cohesive, uniform coating of hard tungsten/tungsten carbide. In these examples, the nickel plated specimens were heated to the deposition temperature and cooled down from the deposition temperature in the presence of argon instead of a mixture of argon and hydrogen to minimize the possibility of hydrogen inclusion in the titanium or titanium alloy.

EXAMPLE 18

This example illustrates the use of an argon plasma etch cleaning procedure applied to the titanium or titanium alloys Ti/6Al/4V material before electroless plating with nickel.

A specimen coupon of Ti/6Al/4V is placed in a vacuum chamber equipped with two parallel plate electrodes, 5' in diameter and separated by 2. One plate is grounded, and the Ti/6Al/4V specimen is mounted in a sample holder attached to this plate. The second plate is insulated from the walls of the vacuum chamber, and connected to the output of an rf power source operating at 14 MHz. The system is evacuated to $10^{31}$ $^3$ Torr. following which argon is flowed through the vacuum chamber at 0.2 Torr. The specimen is heated to 300° C., and an rf plasma is struck between the two electrodes to etch the surface of the Ti/6Al/4V. The argon plasma etch is continued for 30 minutes, after which the specimen is allowed to cool, the pressure increased to one atmosphere with argon and the specimen removed.

The cleaned Ti/6Al/4V specimen is then plated with 5 μm of nickel by the electroless plating technique of Example 1, followed by heat treatment as described in Example 7 and coating with $W/W_2C$ in a low temperature CVD process as described in Example 17. The coating is expected to be smooth, bright and adherent with a hardness of ~2800 Vickers.

EXAMPLE 19

This example illustrates the use of the invention to achieve adherent hard coatings deposited by plasma-assisted CVD (PACVD) on titanium or titanium alloys.

A specimen of titanium alloy (Ti/6Al/4V) is nickel plated and heat treated as described in Example 7. The specimen is then placed in a vacuum chamber equipped for PACVD with two insulated parallel plate electrodes and gas supplies for argon, silane and methane. The Ti/6Al/4V specimen is mounted in a part holder attached to one of the electrodes, which can be negatively biased with respect to the second, and is also equipped with a heating element. The second electrode is connected to the output of a 14 MHz rf power supply. The vacuum chamber is evacuated to $10^{-3}$ Torr. and the part is heated, by means of the heating element attached to the electrode, to 500° C. Argon is then flowed through the chamber at a pressure of 0.2 Torr. and an rf plasma is struck between the electrodes for thirty minutes to clean the surface of the specimen. Silane and methane are then introduced into the chamber at a pressure of 1 Torr. while maintaining a temperature of 500° C., an rf power of 250W and biasing the specimen at −100V. After 2 hours, the power is turned off, the specimen cooled in argon, the chamber pressurized to 1 atmosphere, and the part removed.

The Ti/6Al/4V is expected to be coated with ~3μm of adherent, smooth, amorphous SiC with a hardness of ~2500 kg/mm$^2$.

EXAMPLE 20

This example illustrates the use of this invention to achieve adherent hard coatings deposited by PVD techniques on titanium or titanium alloys.

A specimen of titanium alloy (Ti/6Al/4V) is nickel plated and heat treated as described in Example 7. The specimen is then placed in a vacuum chamber equipped for sputter ion plating (SIP) PVD, containing titanium electrodes placed around the inner walls of the vessel and held at ground potential, a central insulated electrode, external heating coils and means for introducing argon and nitrogen. The Ti/6Al/4V specimen is attached to the central electrode.

The system is evacuated to $10^{-3}$ Torr. and filled with argon to $10^{-2}$ Torr. while the temperature of the vacuum chamber is raised to 400° C. A dc negative potential of −500V is then applied to the central electrode and the specimen for 30 minutes, causing argon ion sputtering of the specimen surface for cleaning. Nitrogen is then fed into the chamber, while maintaining the pressure at $10^{-2}$ Torr. and applying a 1 kV dc positive potential between the specimen and the Ti wall electrodes. The glow discharge causes Ti atoms to be sputtered toward the specimen which react with $N_2$ to form a coating of TiN on the specimen. The process is continued for 5 hours to build up 5 μm of TiN, when the power is disconnected, the chamber cooled and pressurized with argon to 1 atmosphere, and the part removed. The surface of the Ti/6Al/4V specimen is expected to be coated with an adherent, smooth coating of TiN, with a hardness of ~1800 kg/mm$^2$.

EXAMPLE 21

This example illustrates the use of the invention to achieve adherent, hard, diamond-like carbon coatings deposited by PACVD on titanium or titanium alloys.

A specimen of titanium alloy (Ti/6Al/4V) is nickel plated and heat treated as described in Example 7. The specimen is then placed in a vacuum chamber equipped for PACVD with two insulated parallel plate electrodes and gas supplies for argon, hydrogen and methane. The Ti/6Al/4V specimen is mounted in a part holder attached to one of the electrodes, which can be negatively biased with respect to the second, and is also equipped with a heating element. The second electrode is connected to the output of a 14 MHz rf power supply. The vacuum chamber is evacuated to $10^{-3}$ Torr. and the part is heated, by means of the heating element attached to the electrode, to 500° C.

Argon is then flowed through the chamber at a pressure of 0.2 Torr. and an rf plasma is struck between the electrodes for thirty minutes to clean the surface of the specimen. A mixture of 5% $CH_4$ in $H_2$ is then flowed through the chamber at a pressure of 1 Torr. while maintaining a temperature of 500° C., and biasing the specimen at −100 V. After 2 hours, the power is turned off, the specimen cooled in argon, the chamber pressurized to 1 atmosphere and the part removed. The Ti/6Al/4V is expected to be coated with an adherent amorphous diamond-like carbon film, with a hardness of ~1800 kg/mm$^2$.

SUMMARY

From the foregoing description, one of ordinary skill in the art can easily ascertain that the present invention provides a novel method for producing coated substrate and products comprised of titanium or titanium alloy substrate, at least one thin interlayer of a non-reactive noble metal and a hard outer coating. The method of the invention makes it possible for the first time to create coated substrate products on titanium metals and alloys.

Without departing from the spirit and scope of this invention, one of ordinary skill can make various changes and modifications to the invention to adapt it to various usages and conditions. As such, these changes and modifications are properly, equitably, and intended to be, within the full range of equivalence of the following claims.

What is claimed is:

1. A coated substrate product comprised of
   (1) a substrate selected from the group consisting of titanium and titanium alloy, which substrate has been treated with a mild abrasive to remove oxides from its surface,
   (2) a thin, non-reactive noble metal interlayer deposited by an electroless plating technique after the treatment with said mild abrasive, said noble metal coated substrate is then subjected to a heat treatment by heating the substrate and the noble metal interlayer to a temperature in the range of about 200° to about 300° C. in the presence of air or a temperature in the range of about 200° to about 475° C. in the presence of an inert gas selected from the group consisting of argon, helium and mixtures thereof, and
   (3) a hard outer coating selected from the group consisting of a ceramic, a hard metal, a hard metal compound and a carbon having a hardness of greater than 1,000 Vickers.

2. A coated substrate product according to claim 1 wherein the non-reactive noble metal interlayer is consisting of a noble metal selected from the group comprised of cobalt, rhodium, iridium, nickel, palladium, platinum, copper, silver and gold, alloys thereof and mixtures thereof.

3. A coated substrate product according to claim 1 wherein said hard outer coating is selected from the group consisting of oxides, carbides, nitrides, carbonitrides, borides and silicides of the Group IIIB or Group IVB elements of the Periodic Table; transition element metals; oxides, carbides, nitrides, carbonitrides, silicides and borides of transition element metals; a carbon having a hardness of greater than 1,000 Vickers; and mixtures thereof.

4. A coated substrate product according to claim 1 wherein the noble metal interlayer is from about 0.5 microns to about 15 microns in thickness.

5. A coated substrate produce according to claim 1 wherein said hard outer coating has a hardness of at least 350 Vickers.

6. A coated substrate product comprised of:
(1) a substrate selected from the group consisting of titanium and titanium alloys, which substrate has been treated with a mild abrasive to remove oxides from its surfaces,
(2) two thin, non-reactive noble metal interlayers herein at least the non-reactive noble metal interlayer which is immediately adjacent to the substrate is deposited on the substrate by means of an electroless plating technique after treatment with said mild abrasive to remove oxides from its surface, said noble metal coated substrate is then subjected to a heat treatment by heating the substrate and the noble metal interlayers to a temperature in the range of about 200° to about 300° C. in the presence of air or a temperature in the range of about 200° to about 475° C. in the presence of an inert gas selected from the group consisting of argon, helium and mixtures thereof, and
(3) a hard outer coating selected from the group consisting of a ceramic, a hard metal, a hard metal compound and a carbon having a hardness of greater than 1,000 Vickers onto the noble metal interlayers.

7. A coated substrate product according to claim 6 wherein the thin noble metal interlayers are selected from the group consisting of cobalt, rhodium, iridium, nickel, palladium, platinum, copper, silver and gold, alloys thereof and mixtures thereof.

8. A coated substrate product according to claim 6 wherein the two thin noble metal interlayers together are about 0.5 microns to about 15 microns in thickness.

9. A coated substrate product according to claim 6 wherein the noble metal interlayer which is not immediately adjacent to the titanium or titanium alloy substrate is deposited onto the interlayer which is immediately adjacent to the substrate by means of an electrochemical plating technique.

10. A coated substrate product according to claim 6 wherein said hard outer coating has a hardness of at least 350 Vickers.

11. A coated substrate product comprised of: (1) a titanium or titanium alloy substrate which has been treated with a mild abrasive to remove oxides from its surface, (2) a thin nickel interlayer which was deposited onto the substrate by means of an electroless plating technique, after treatment with said mild abrasive, said nickel coated substrate is then subjected to a heat treatment by heating the substrate and the nickel interlayer to a temperature in the range of about 200° to about 475° C. in the presence of an inert gas selected from the group comprising argon, helium and mixtures thereof and (3) an outer coating of tungsten and/or tungsten carbide.

12. A coated substrate product according to claim 11 wherein the nickel interlayer is from about 0.5 microns to about 15 microns in thickness.

13. A coated substrate product comprised of:
(1) a titanium or titanium alloy substrate which has been treated with a mild abrasive to remove oxides from its surface,
(2) a first noble metal interlayer comprised of a thin nickel interlayer which was deposited onto the titanium substrate by means of an electroless plating technique, and a second noble metal interlayer comprised of a thin layer of copper which is deposited onto the nickel interlayer by means of an electrochemical plating technique, said noble metal coated substrate is then subjected to a heat treatment by heating the substrate and the noble metal interlayers to a temperature in the range of about 200° to about 300° C. in the presence of air or a temperature in the range of about 200° to about 475° C. in the presence of an inert gas selected from the group comprising argon, helium and mixtures thereof, and
(3) an outer coating of tungsten and/or tungsten carbide.

14. A coated substrate product according to claim 13 wherein the first nickel interlayer is about one micron thick and the second copper interlayer is about 4 microns thick.

* * * * *

UNITED STATES PATENT AND TRADEMARK OFFICE
CERTIFICATE OF CORRECTION

PATENT NO. : 5,009,966  
DATED : April 23, 1991  
INVENTOR(S) : Garg, et al.

Page 1 of 2

It is certified that error appears in the above-identified patent and that said Letters Patent is hereby corrected as shown below:

In the Abstract:

Line 2, between "titanium" and "titanium" delete "of" insert -- or --.

Column 6, line 8, "periodic" should be -- Periodic --.

Column 8, line 26, "paper" should be -- Paper --.

Column 8, line 63, "IndIcate" should be -- indicate --.

Column 9, line 5, "wIth" should be -- with --.

Column 14, line 59, "$10^{31}$ 3" should be -- $10^{-3}$ --.

Column 15, line 21, "$10^{31}$ 3 should be -- $10^{-3}$ --.

Column 15, line 51, "$10^{31}$ 3" should be -- $10^{-3}$ --.

Column 15, line 52, "$10^{31}$ 2" should be -- $10^{-2}$ --.

Column 15, line 58, "$10^{31}$ 2" should be -- $10^{-2}$ --.

Column 16, line 16, "$10^{31}$ 3" should be -- $10^{-3}$ --.

Column 17, line 22, "produce" should be -- product --.

UNITED STATES PATENT AND TRADEMARK OFFICE
CERTIFICATE OF CORRECTION

PATENT NO. : 5,009,966

DATED : April 23, 1991

INVENTOR(S) : Garg, et al.

It is certified that error appears in the above-identified patent and that said Letters Patent is hereby corrected as shown below:

Column 17, line 31, "herein" should be -- wherein --.

Signed and Sealed this

Twenty-ninth Day of September, 1992

Attest:

DOUGLAS B. COMER

*Attesting Officer*  *Acting Commissioner of Patents and Trademarks*